(12) United States Patent
Adachi et al.

(10) Patent No.: US 7,126,441 B2
(45) Date of Patent: Oct. 24, 2006

(54) ELECTRONIC COMPONENT HAVING A CONNECTION MEMBER CONNECTING A RESONATOR TERMINAL AND A MOUNTING SUBSTRATE ELECTRODE

(75) Inventors: Takuya Adachi, Tokyo (JP); Taku Takeishi, Tokyo (JP); Kenji Inoue, Tokyo (JP)

(73) Assignee: TDK Corporation, Tokyo (JP)

( * ) Notice: Subject to any disclaimer, the term of this patent is extended or adjusted under 35 U.S.C. 154(b) by 118 days.

(21) Appl. No.: 10/985,954

(22) Filed: Nov. 12, 2004

(65) Prior Publication Data
US 2005/0200429 A1    Sep. 15, 2005

(30) Foreign Application Priority Data
Nov. 18, 2003    (JP)    ............................. 2003-387692

(51) Int. Cl.
*H03H 9/70*    (2006.01)
*H03H 9/72*    (2006.01)

(52) U.S. Cl. ........................................ 333/133; 333/193
(58) Field of Classification Search ................ 333/133
See application file for complete search history.

(56) References Cited

U.S. PATENT DOCUMENTS

| | | | | |
|---|---|---|---|---|
| 6,081,171 A | * | 6/2000 | Ella | .......................... 333/189 |
| 6,154,940 A | * | 12/2000 | Onishi et al. | ............... 29/25.35 |
| 6,166,611 A | * | 12/2000 | Seki et al. | .................... 333/193 |
| 6,509,813 B1 | * | 1/2003 | Ella et al. | .................... 333/187 |
| 6,756,864 B1 | * | 6/2004 | Muramatsu | ................. 333/133 |
| 6,815,869 B1 | * | 11/2004 | Baba et al. | ............. 310/313 R |
| 6,822,537 B1 | * | 11/2004 | Taniguchi et al. | .......... 333/194 |
| 6,882,250 B1 | * | 4/2005 | Uriu et al. | ................... 333/193 |
| 6,911,708 B1 | * | 6/2005 | Park | ........................... 257/416 |
| 6,927,649 B1 | * | 8/2005 | Metzger et al. | ............. 333/133 |
| 7,023,297 B1 | * | 4/2006 | Taniguchi et al. | .......... 333/133 |

FOREIGN PATENT DOCUMENTS

JP    2002-237739    8/2002

* cited by examiner

*Primary Examiner*—Barbara Summons
(74) *Attorney, Agent, or Firm*—Oliff & Berridge, PLC

(57) ABSTRACT

An electronic component according to an embodiment of the present invention comprises a resonator, a mounting substrate, and an electric connection member. The resonator has a terminal. The mounting substrate has a first principal surface, a second principal surface opposite to the first principal surface, and an electrode provided in a hole intersecting with the second principal surface. The electric connection member electrically connects the electrode of the mounting substrate to the terminal of the resonator. One end of the electrode of the mounting substrate is provided along the second principal surface. The electric connection member is provided on the one end of the electrode of the mounting substrate. The resonator is provided on the electric connection member so that the terminal of the resonator is in contact with the electric connection member.

15 Claims, 10 Drawing Sheets

Fig.9  -- Related Art --
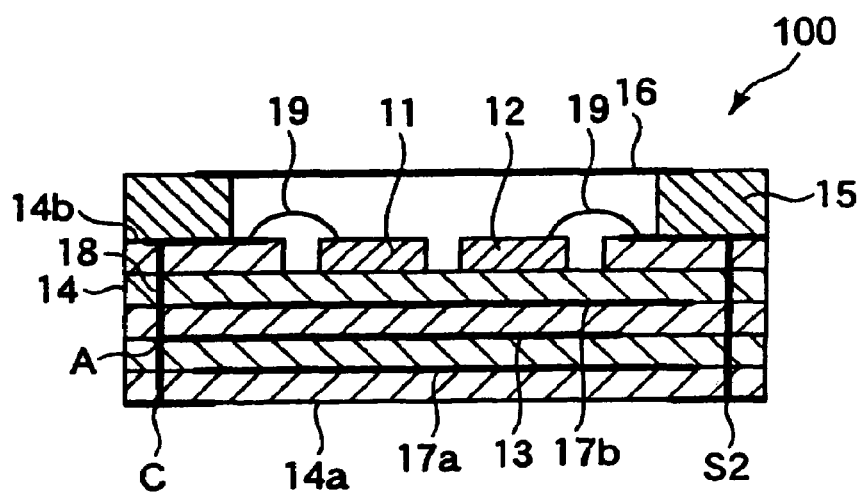

Fig.10  -- Related Art --
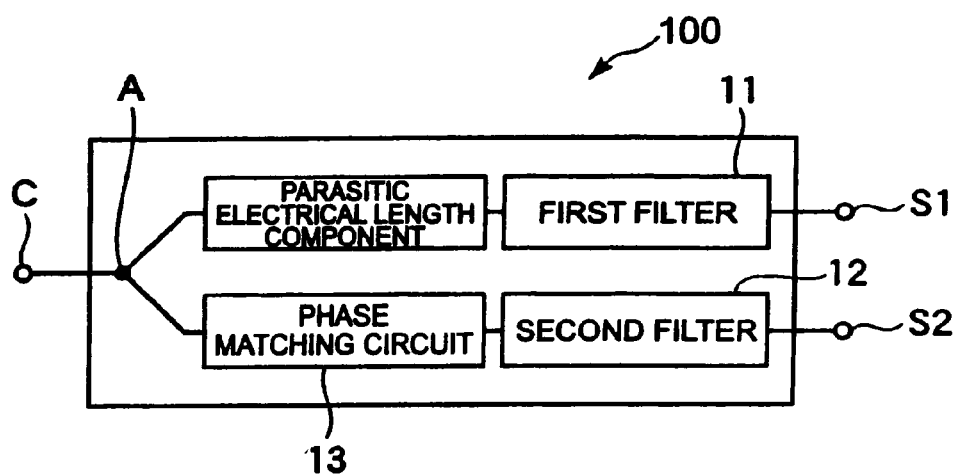

ELECTRONIC COMPONENT HAVING A CONNECTION MEMBER CONNECTING A RESONATOR TERMINAL AND A MOUNTING SUBSTRATE ELECTRODE

BACKGROUND OF THE INVENTION

1. Field of the Invention

The present invention relates to an electronic component and, more particularly, to an electronic component incorporating a resonator.

2. Related Background of the Invention

Mobile communication devices typified by cell phones are in remarkably widespread use in these days and are rapidly being downsized. In conjunction therewith, components used in the mobile communication devices are demanded to be more downsized and sophisticated.

A branching filter (electronic component) is used for branching or generation of a transmitted signal and a received signal in such mobile communication devices. An example of the branching filter is one comprised of a band-pass filter, a band-stop filter, or a combination of these, and another example of the branching filter for achieving further downsizing and sophistication is one comprised of two filters (resonators) having mutually different band center frequencies.

FIG. 8 shows a functional configuration of a branching filter using two filters with different band center frequencies. In the branching filter (electronic component) 10 shown in FIG. 8, a phase matching circuit 13 is connected to a second filter 12, and matching between impedance characteristics of two filters 11, 12 is made by change of phase. The first filter 11 and the phase matching circuit 13 are connected to a branch point A at an extension from a common terminal C. Input/output terminals S1, S2 for branched signals are connected to the first filter 11 and to the second filter 12, respectively.

FIG. 9 shows a structure of a conventional branching filter for implementing the functional configuration shown in FIG. 8. The branching filter 100 shown in FIG. 9 consists of five layers. This branching filter is comprised of a first filter 11, a second filter 12, a mounting substrate 14, a frame 15, and a shield lid 16. The first filter 11 and the second filter 12 are mounted on the mounting substrate 14. The frame 15 is attached to the mounting substrate board 14 so as to surround the filters 11, 12. The shield lid 16 is fixed to the frame 15 to seal the filters 11, 12 in.

The mounting substrate 14 has a first principal surface 14a and a second principal surface 14b. A common terminal C, input/output terminals S1, S2 (the input/output terminal S1 of which is not shown), and a ground terminal (not shown) are formed on the first principal surface 14a. The filters 11, 12 are mounted on the second principal surface 14b. Two ground layers 17a, 17b are formed in the mounting substrate 14 so as to sandwich a phase matching circuit 13 in the stack direction. Furthermore, a via electrode 18 is formed in the mounting substrate 14. The via electrode 18 is constructed of an electric conductor placed inside a through hole opening at one end in the first principal surface 14a and also opening at the other end in the second principal surface 14b. The via electrode 18 is connected to the common terminal C on the first principal surface 14a and is connected through a bonding pad to the first filter 11 by a bonding wire 19 on the second principal surface 14b. Furthermore, one end of the aforementioned phase matching circuit 13 is connected to a halfway position of the via electrode 18, i.e., a branch point A, and the other end to the second filter 12.

The connection of the filters in the branching filter having the phase matching circuit is described, for example, in Japanese Patent Application Laid-Open No. 2002-237739.

SUMMARY OF THE INVENTION

The branching filter described above has the structure in which the position of the branch point A from the common terminal C to the two filters 11, 12 is physically distant from the first filter 11. Therefore, this branching filter inevitably includes a parasitic electrical length component between the first filter 11 and the branch point A, as shown in an equivalent circuit of the branching filter 100 in FIG. 10, and it causes a mismatch to degrade the frequency characteristics.

The degradation of the frequency characteristics due to such routing of the transmission line occurs not only in the branching filters, but also commonly in electronic components equipped with resonators.

It is, therefore, an object of the present invention to provide an electronic component equipped with a resonator, which is prevented from suffering the degradation of the frequency characteristics due to the routing of the transmission line.

An electronic component according to the present invention comprises a resonator, a mounting substrate, an electric connection member. The resonator has a terminal. The mounting substrate comprises a first principal surface, a second principal surface opposite to the first principal surface, and an electrode provided in a hole intersecting with the second principal surface. The electric connection member electrically connects the electrode of the mounting substrate with the terminal of the resonator. One end of the electrode of the mounting substrate is provided along the second principal surface. The electric connection member is provided on the one end of the electrode of the mounting substrate. The resonator is provided on the electric connection member so that the terminal of the resonator is in contact with the electric connection member. The one end of the electrode of the mounting substrate, the electric connection member, and the terminal of the resonator are preferably arranged sequentially in the direction.

Since the electronic component has the configuration wherein the electric connection member is provided on the one end of the electrode of the mounting substrate and the terminal of the resonator is on the electric connection member, the length of the transmission line is short between the electrode of the mounting substrate and the terminal of the resonator. Therefore, the degradation of the frequency characteristics is prevented.

The electronic component according to the present invention further comprises another resonator having a band center frequency different from that of the aforementioned resonator, the other resonator being mounted on the second principal surface of the mounting substrate. In this case, the mounting substrate preferably comprises: a phase matching circuit electrically connected to the foregoing electrode of the mounting substrate and to the other resonator; a penetrating electrode provided in a through hole extending from the first principal surface to the second principal surface, and electrically connected to the aforementioned electrode on the second principal surface; and an external connection terminal provided on the first principal surface and electrically connected to the penetrating electrode on the first principal surface.

In the electronic component of this configuration, a contact between the electrode of the mounting substrate and the electric connection member is a branch point between the transmission line to the resonator and the transmission line to the other resonator. Therefore, the length of the transmission line from the branch point to the resonator is short.

The electronic component according to the present invention further comprises another resonator having a band center frequency different from that of the aforementioned resonator, the other resonator being mounted on the second principal surface of the mounting substrate. In this case, preferably, the electrode of the mounting substrate is a penetrating electrode extending from the first principal surface to the second principal surface, and the mounting substrate comprises: another electrode provided in a hole intersecting with the second principal surface and electrically connected to the penetrating electrode on the second principal surface; a phase matching circuit electrically connected to the other electrode and to the other resonator; and an external connection terminal provided on the first principal surface and electrically connected to the penetrating electrode on the first principal surface.

In the electronic component of this configuration, a contact between the penetrating electrode of the mounting substrate and the electric connection member is a branch point between the transmission line to the resonator and the transmission line to the other resonator. Therefore, the length of the transmission line from the branch point to the resonator is short.

In the electronic component of the present invention, the external connection terminal may be at least one of a common terminal, a ground terminal, and an input/output terminal.

In the electronic component of the present invention, the electric connection member is preferably a bump.

In the electronic component of the present invention, the resonator, or each of the resonator and the other resonator may be a piezoelectric resonator which obtains a signal of a predetermined resonant frequency from a bulk wave propagating inside a piezoelectric film. In the electronic component of the present invention, the resonator, or each of the resonator and the other resonator may be a surface acoustic wave resonator which obtains a signal of a predetermined resonant frequency from a surface acoustic wave propagating in a surface of a piezoelectric material.

The electronic component of the present invention preferably has a chip size package structure in which the resonator, or each of the resonator and the other resonator is shielded with resin.

BRIEF DESCRIPTION OF THE DRAWINGS

FIG. 9 is a sectional view showing a conventional branching filter.

FIG. 10 is a block diagram showing the functional configuration of the branching filter shown in FIG. 9, along with a parasitic electrical length component.

DESCRIPTION OF THE PREFERRED EMBODIMENTS

The best mode for carrying out the present invention will be described below in further detail with reference to the drawings. The same members and the same portions will be denoted by the same reference symbols throughout the accompanying drawings and redundant description will be omitted. Since the description herein concerns the best mode for carrying out the present invention, it is to be understood that the present invention is not limited to the mode.

First Embodiment

Figure 1:
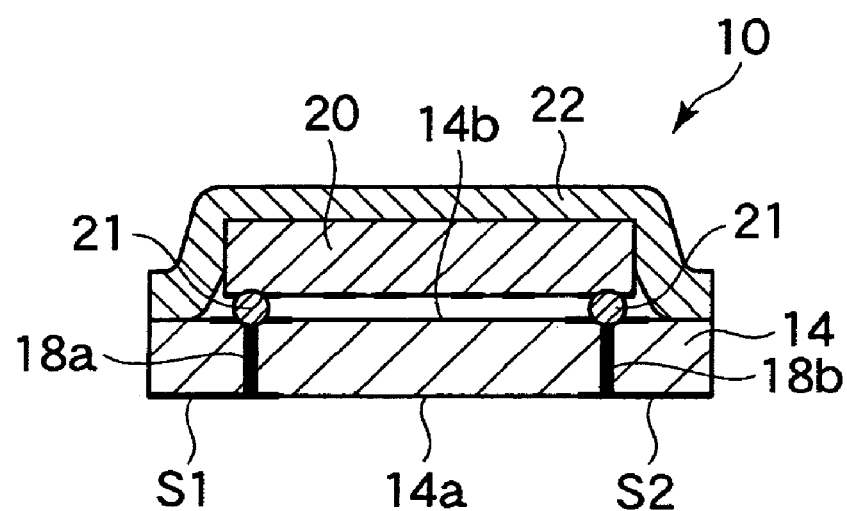
FIG. 1 is a sectional view showing an example of the electronic component according to the first embodiment of the present invention.
Figure 2:
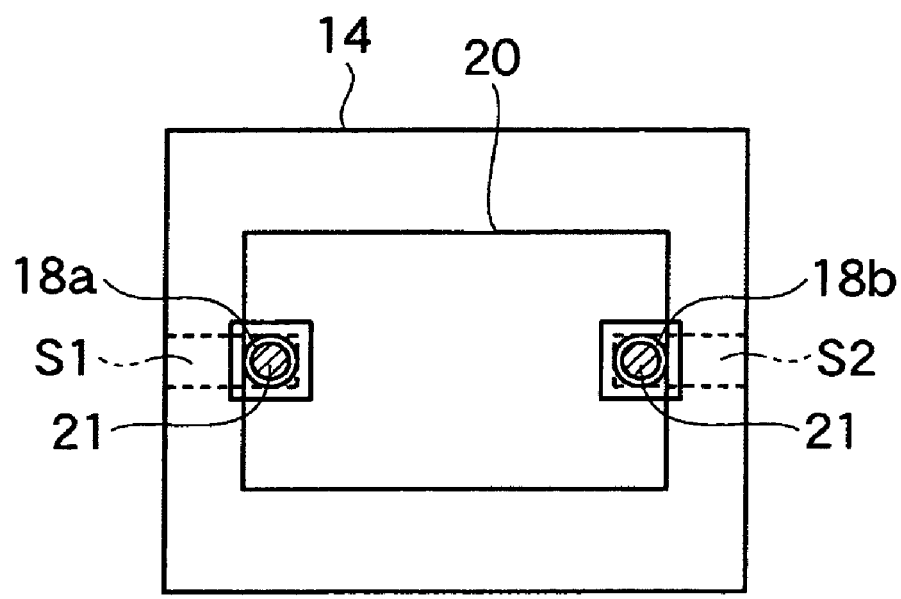
FIG. 2 is a plan view showing a mounting substrate forming the electronic component of FIG. 1.
Figure 3:
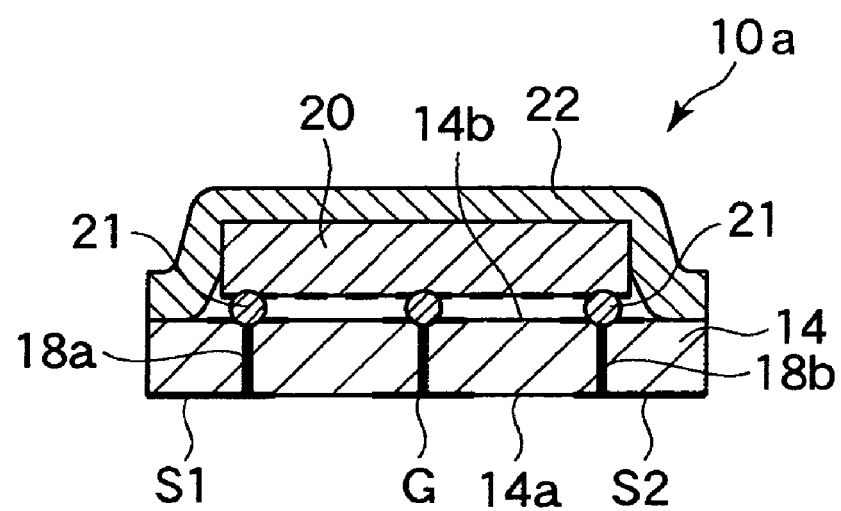
FIG. 3 is a sectional view showing another example of the electronic component according to the first embodiment of the present invention.

FIG. 1 is a sectional view showing an example of the electronic component according to the first embodiment of the present invention, FIG. 2 a plan view showing a mounting substrate forming the electronic component of FIG. 1, and FIG. 3 a sectional view showing another example of the electronic component according to the first embodiment of the present invention.

The electronic component 10 shown in FIGS. 1 and 2 has a mounting substrate 14, and a resonator 20 mounted on this mounting substrate 14. This resonator 20 is a piezoelectric type resonator which obtains a signal of a predetermined band center frequency from a bulk wave propagating inside a piezoelectric film by piezoelectric effect with application of an ac voltage between a lower electrode and an upper electrode not shown. Bumps (electric connection members) 21 such as stud bumps or plated bumps are formed on the electrodes or terminals of the resonator 20, and the resonator 20 is mounted through the bumps 21 on a second principal surface 14b of the mounting substrate 14 by face down bonding.

Input/output terminals S1, S2 being external connection terminals are formed on a first principal surface 14a of the mounting substrate 14 and the resonator 20 is mounted on the second principal surface 14b as described above. The mounting substrate 14 is provided with two through holes opening at one end in the first principal surface 14a and opening at the other end in the second principal surface 14b and electric conductors are placed inside these two through holes to form electrodes 18a, 18b. Namely, the mounting substrate 14 is provided with the holes intersecting with the second principal surface 14b, and the electrodes 18a, 18b are provided inside the holes. In FIG. 1, a ground terminal (not shown) is also provided on the first principal surface 14a.

The input/output terminals S1 and S2 are provided on the first principal surface 14a of the mounting substrate 14. The input/output terminal S1 is electrically connected to the end of the electrode 18a on the first principal surface 14a side. The input/output terminal S2 is electrically connected to the end of the electrode 18b on the first principal surface 14a side. The end of each electrode 18a, 18b on the second principal surface 14b side is connected through the bump 21 to the terminal of the resonator 20. Namely, the bump 21 is provided on the end of each electrode 18a, 18b on the second principal surface 14b side, and the resonator 20 is provided so that the terminals of the resonator 20 are in contact with the corresponding bumps 21. In the present embodiment, the end of the electrode 18a on the second principal surface 14b side, the bump 21, and the terminal of the resonator 20 are arranged sequentially in a direction intersecting with the second principal surface 14b. The end of the electrode 18b on the second principal surface 14b side, the bump 21, and the terminal of the resonator 20 are also arranged sequentially in the mentioned direction.

In the electronic component 10, another external connection terminal may also be formed at a position except for those of the ends of the electrodes 18a, 18b. The types of the external connection terminals are not limited to those described above.

The resonator 20 mounted on the mounting substrate 14 is shielded with dropped resin 22, thus constituting a chip size package (CSP) structure.

Since the electronic component 10 of the present embodiment has the configuration wherein the bumps 21 are provided on the ends of the electrodes 18a and 18b on the second principal surface 14b side and the terminals of the resonator 20 are provided on the bumps 21, as described above, the lengths of the transmission lines for electrically connecting the electrodes 18a and 18b to the terminals of the resonator 20 are short. Since the resonator 20 is connected through the bumps 21 to the ends of the electrodes 18a, 18b on the second principal surface 14b side, which are connected to the input/output terminals S1, S2 being the external connection terminals, the signal transmission paths from the input/output terminals S1, S2 to the resonator 20 are short. Therefore, the signal transmission loss is reduced and it is thus feasible to prevent the degradation of the frequency characteristics due to routing of the transmission lines.

Particularly, when the bumps 21 are located immediately above the electrodes 18a, 18b, as illustrated, the transmission paths are shortest and the transmission loss can be further reduced.

The above description concerned the application of the input/output terminals S1, S2 as external connection terminals, but a ground terminal G may also be applied as an external connection terminal, as in the electronic component 10a shown in FIG. 3. This reduces the parasitic reactance (inductance), so as to improve pass characteristics and pass stop characteristics.

Second Embodiment

Figure 4:
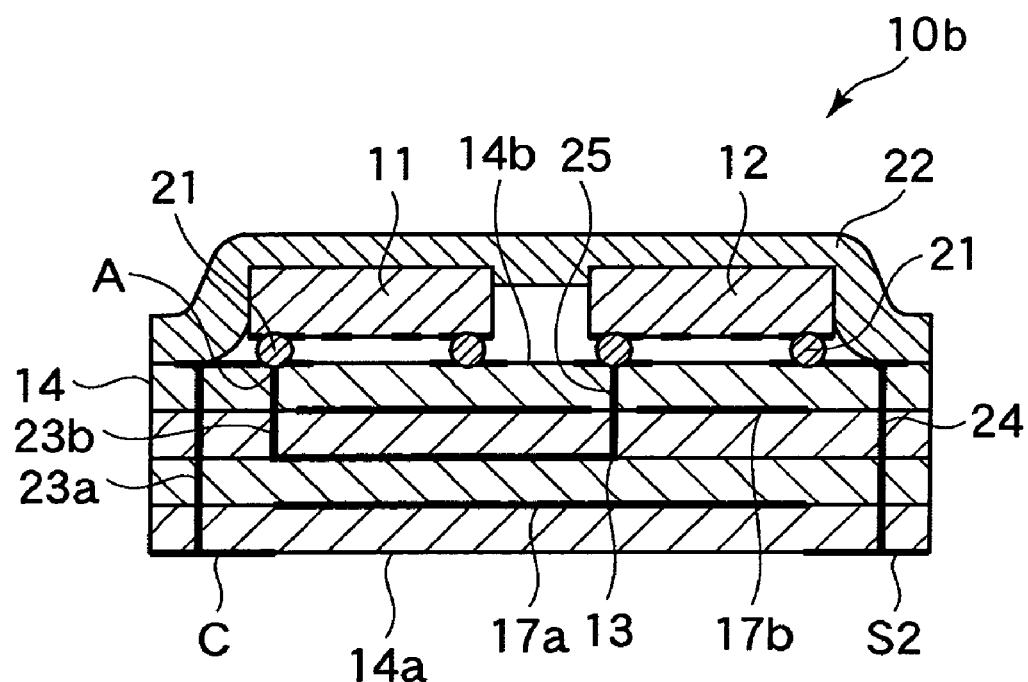
FIG. 4 is a sectional view showing an example of the electronic component according to the second embodiment of the present invention.
Figure 5:
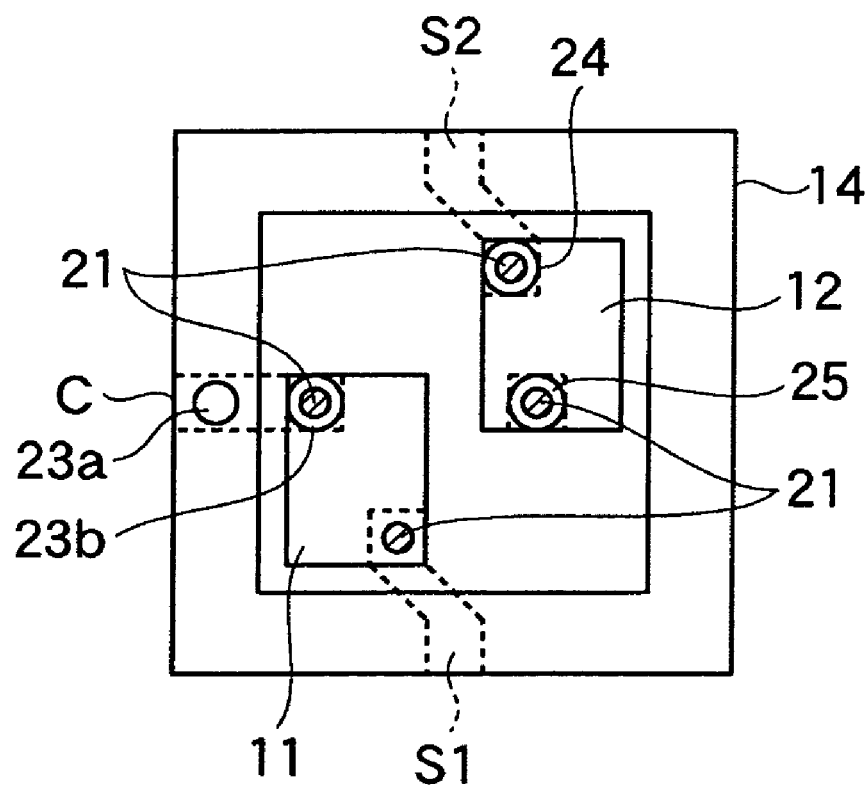
FIG. 5 is a plan view showing a mounting substrate forming the electronic component of FIG. 4.
Figure 6:
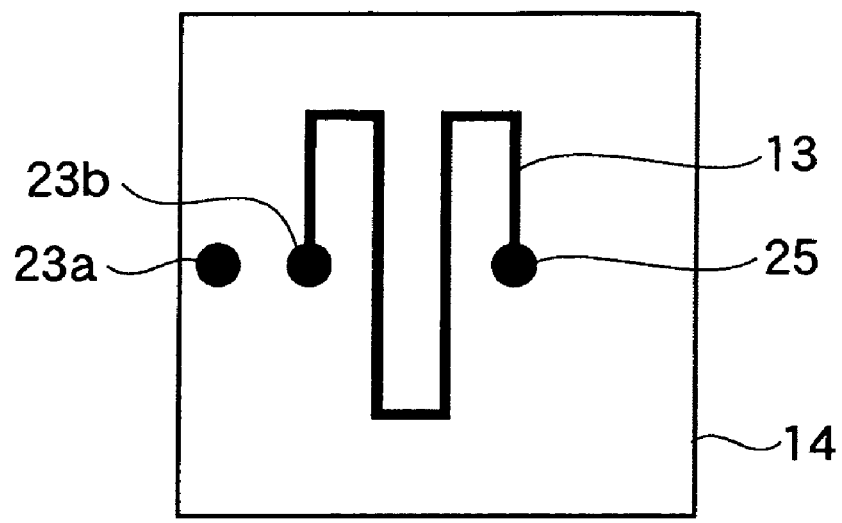
FIG. 6 is a plan view showing a phase matching circuit formed in the mounting substrate forming the electronic component of FIG. 4.
Figure 7:
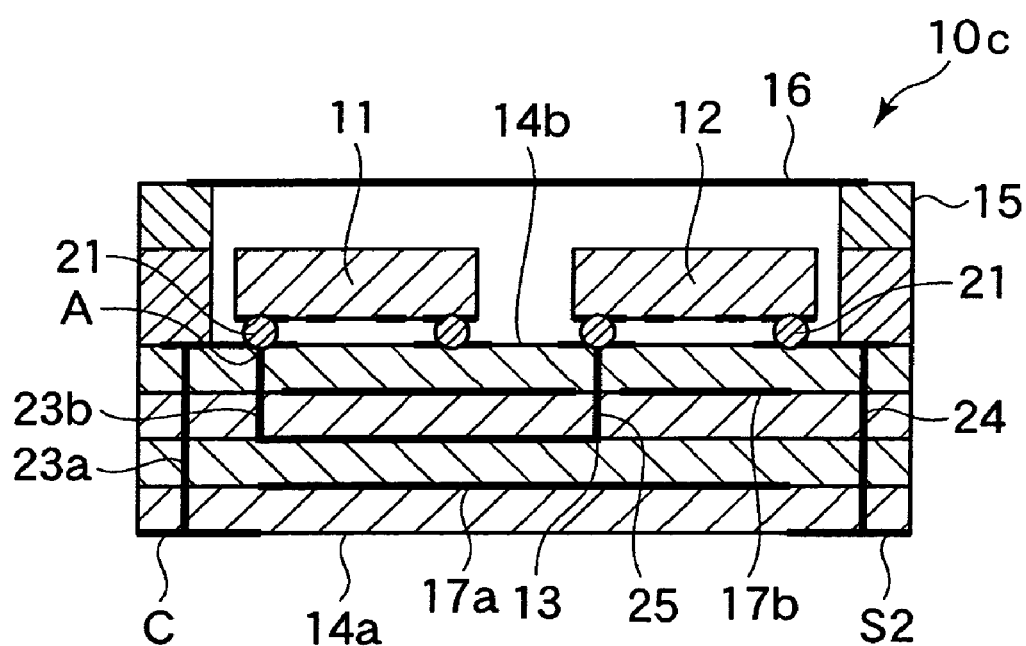
FIG. 7 is a sectional view showing another example of the electronic component according to the second embodiment of the present invention.

FIG. 4 is a sectional view showing an example of the electronic component according to the second embodiment of the present invention, FIG. 5 a plan view showing a mounting substrate forming the electronic component of FIG. 4, FIG. 6 a plan view showing a phase matching circuit formed in the mounting substrate forming the electronic component of FIG. 4, and FIG. 7 a sectional view showing another example of the electronic component according to the second embodiment of the present invention.

The electronic component 10b shown in FIGS. 4, 5, and 6 is a branching filter using a first filter (resonator) 11 as a transmitting end filter and a second filter (another resonator) 12 as a receiving end filter having their respective band center frequencies different from each other.

Figure 8:
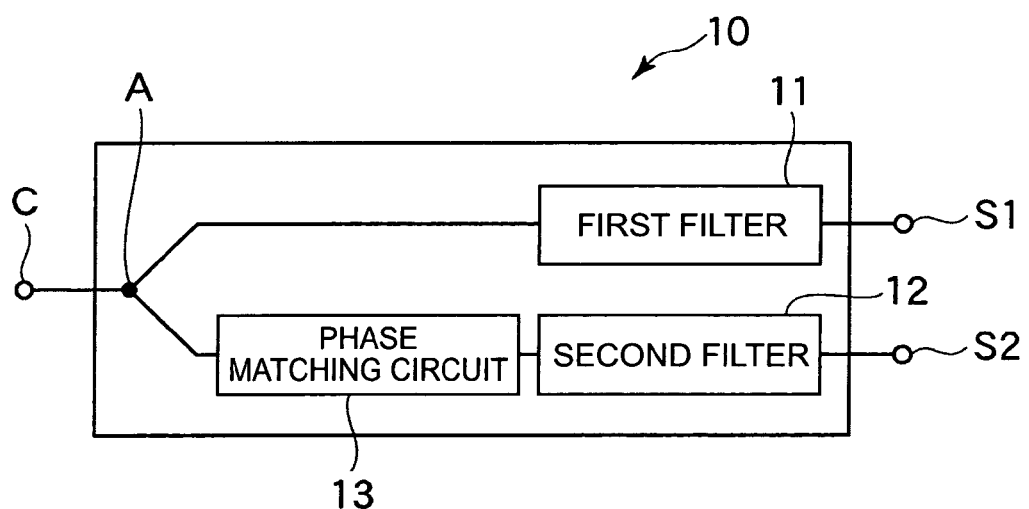
FIG. 8 is a block diagram showing a functional configuration of a branching filter.

The functional configuration of the electronic component 10b of the present embodiment is similar to that shown in FIG. 8 described previously. The filters 11, 12 are piezoelectric type resonators similar to that in the first embodiment.

The electronic component 10b being a branching filter consists, for example, of four layers, and is comprised of a mounting substrate 14 equipped with the first filter 11 and the second filter 12, and resin 22 dropped onto the filters 11, 12 to shield them, thus forming a chip size package (CSP) structure.

A common terminal C, input/output terminals S1, S2, and a ground terminal (not shown) are formed as external connection terminals on the first principal surface 14a of the mounting substrate 14, and the filters 11, 12 are mounted on the second principal surface 14b. Two ground layers 17a, 17b are formed in the mounting substrate 14 so as to sandwich a phase matching circuit 13 in the stack direction.

The mounting substrate 14 is provided with a through hole (penetrating hole) opening at one end in the first principal surface 14a and opening at the other end in the second principal surface 14b, and an electric conductor is placed inside the through hole to form a penetrating electrode 23a. The end of the penetrating electrode 23a on the first principal surface 14a side is electrically connected to the common terminal C provided on the first principal surface 14a.

The mounting substrate 14 is provided with a hole opening at one end in the second principal surface 14b, and an electric conductor is placed in the hole to form an electrode 23b. The electrode 23b is electrically connected to the penetrating electrode 23a on the second principal surface 14b. The end of the electrode 23b on the side opposite to the second principal surface 14b is connected to the phase matching circuit 13.

The mounting substrate 14 is also provided with a through hole opening at one end in the first principal surface 14a and opening at the other end in the second principal surface 14b, and an electric conductor is placed inside the through hole to form an electrode 24. The end of the electrode 24 on the first principal surface 14a side is electrically connected to the input/output terminal S2 provided on the first principal surface 14a. The end of the electrode 24 on the second principal surface 14b side is connected through a bump 21 to a terminal of the second filter 12.

Furthermore, the mounting substrate 14 is provided with a hole opening at one end in the second principal surface 14b, and an electric conductor is placed in the hole to form an electrode 25. The end of the electrode 25 on the second principal surface 14b side is connected through a bump 21 to a terminal of the filter 12. The end of the electrode 25 on the side opposite to the second principal surface 14b is electrically connected to the phase matching circuit 13.

Another external connection terminal may also be formed at a position except for those of the ends of the electrodes 23a, 24 in the electronic component 10b. The types of the external connection terminals are not limited to those described above.

In this electronic component 10b, a bump (electric connection member) 21 is provided on the end of the electrode 23b on the second principal surface 14b side, and the first filter 11 is provided so that a terminal of the first filter 11 is in contact with the bump 21. In the present embodiment, the end of the electrode 23b on the second principal surface 14b side, the bump 21, and the terminal of the first filter 11 are arranged sequentially in a direction intersecting with the second principal surface 14b.

The end of the electrode 24 on the second principal surface 14b side is connected through the bump 21 to the second filter 12. Furthermore, the other end of the phase matching circuit 13 connected at one end to the electrode 23b is connected through the electrode 25 and bump 21 to the second filter 12. Therefore, the branch point A shown in FIG. 8 is located at a contact between the end of the electrode 23b on the second principal surface 14b side, and the bump 21 in the electronic component 10b shown in FIG. 4.

In the electronic component 10b shown in FIG. 4, the terminal of the first filter 11 and the end of the electrode 23b on the second principal surface 14b side are connected through the bump 21, but the terminal of the first filter 11 and the end of the penetrating electrode 23a on the second principal surface 14b side may be connected through the bump 21. In this case, the branch point A is located at a contact between the end of the electrode 23a on the second principal surface 14b side, and the bump 21.

In the electronic component 10b of the structure as described above, the electrode 23a connected to the common terminal C being an external connection terminal on the first principal surface 14a is connected to the electrode 23b on the second principal surface 14b, and the terminal of the first filter 11 is electrically connected to the electrode 23a or the electrode 23b on the second principal surface 14b. The electrode 23b is connected to the phase matching circuit 13 connected to the second filter 12. Therefore, the length of the transmission line from the position of the branch point A from the common terminal C, to the first filter 11 can be short. As a result, the parasitic electrical length component of the transmission line is very small, so as to prevent the degradation of the frequency characteristics due to routing of the transmission line, thus enabling achievement of better matching.

Particularly, when the bump 21 is located immediately above the electrode 23b or the electrode 23a as shown, the transmission line becomes shortest, and the transmission loss can be further reduced, so as to decrease the parasitic electrical length component more.

Instead of the configuration wherein the filters 11, 12 are sealed in dropped resin 22, the filters 11, 12 may be airtightly sealed in such a manner as to attach a frame 15 surrounding the filters 11, 12, to the mounting substrate 14 and fix a shield lid 16 to this frame 15, as in the electronic component 10c shown in FIG. 7.

The above description concerned the application of the piezoelectric resonator as the resonator 20 or as the filters 11, 12, but each of the resonator 20 and the filters 11, 12 may also be a surface acoustic wave resonator which obtains a signal of a predetermined resonant frequency from a surface acoustic wave propagating in a surface of a piezoelectric material.

The present invention, the preferred embodiments of which were described above, provides the following effects.

Namely, the electric connection member is provided on the end on the second principal surface side of the electrode of the mounting substrate electrically connected to the external connection terminal and the terminal of the resonator is provided on the electric connection member; therefore, the present invention achieves the short signal transmission path from the external connection terminal to the resonator so as to reduce the signal transmission loss, and also prevents the degradation of the frequency characteristics due to routing of the transmission line.

According to the present invention, the penetrating electrode connected to the external connection terminal on the first principal surface is electrically connected to the electrode connected to the phase matching circuit, on the second principal surface. The electric connection member is provided on the end of the electrode or on the end of the penetrating electrode, and the terminal of the resonator is provided on the electric connection member. The phase matching circuit connected to the foregoing electrode is connected to the other resonator. Therefore, the signal transmission line from the external connection terminal to the resonator is so short as to reduce the signal transmission loss, and the degradation of the frequency characteristics due to the routing of the transmission line is prevented.

Particularly, where a common terminal is applied as an external connection terminal, the length of the transmission line from the position of the branch point from the common terminal, to the resonator can be made so short as to make very small the parasitic electrical length component due to routing of the transmission line, whereby it is feasible to prevent the degradation of the frequency characteristics and to achieve better matching.

What is claimed is:

1. An electronic component comprising:
   a first resonator having a terminal;
   a mounting substrate having a first principal surface, a second principal surface opposite to the first principal surface, and an electrode provided in a hole intersecting with the second principal surface;
   an electric connection member for electrically connecting the electrode to the terminal, and
   a second resonator having a band center frequency different from a band center frequency of the first resonator, said second resonator being mounted on the second principal surface,
   wherein one end of the electrode is provided along the second principal surface,
   wherein the electric connection member is provided on the one end of the electrode,
   wherein the first resonator is provided on the electric connection member so that the terminal is in contact with the electric connection member, and
   wherein the mounting substrate comprises:
   a phase matching circuit electrically connected to the electrode and to the second resonator;
   a penetrating electrode provided in a through hole extending from the first principal surface to the second principal surface, and electrically connected to the electrode on the second principal surface; and
   an external connection terminal provided on the first principal surface and electrically connected to the penetrating electrode on the first principal surface.

2. The electronic component according to claim 1, wherein the first resonator is a piezoelectric resonator which obtains a signal of a predetermined resonant frequency from a bulk wave propagating inside a piezoelectric film.

3. The electronic component according to claim 1, wherein the first resonator is a surface acoustic wave resonator which obtains a signal of a predetermined resonant frequency from a surface acoustic wave propagating in a surface of a piezoelectric material.

4. The electronic component according to claim 1, said electronic component having a chip size package structure in which at least one of the first resonator and the second resonator is shielded with resin.

5. The electronic component according to claim 1, wherein the external connection terminal is one of a common terminal, a ground terminal, and an input/output terminal.

6. The electronic component according to claim 1, wherein each of the first resonator and the second resonator is a piezoelectric resonator which obtains a signal of a predetermined resonant frequency from a bulk wave propagating inside a piezoelectric film.

7. The electronic component according to claim 1, wherein each of the first resonator and the second resonator is a surface acoustic wave resonator which obtains a signal of a predetermined resonant frequency from a surface acoustic wave propagating in a surface of a piezoelectric material.

8. The electronic component according to claim 1, said electronic component having a chip size package structure in which the first resonator and the second resonator are shielded with resin.

9. An electronic component comprising:
a first resonator having a terminal;
a mounting substrate having a first principal surface, a second principal surface opposite to the first principal surface, and an electrode provided in a hole intersecting with the second principal surface;
an electric connection member for electrically connecting the electrode to the terminal; and
a second resonator having a band center frequency different from a band center frequency of the first resonator, said second resonator being mounted on the second principal surface,
wherein one end of the electrode is provided along the second principal surface,
wherein the electric connection member is provided on the one end of the electrode,
wherein the first resonator is provided on the electric connection member so that the terminal is in contact with the electric connection member,
wherein the electrode is a penetrating electrode extending from the first principal surface to the second principal surface, and
wherein the mounting substrate comprises:
another electrode provided in a hole intersecting with the second principal surface and electrically connected to the penetrating electrode on the second principal surface;
a phase matching circuit electrically connected to the other electrode and to the second resonator; and
an external connection terminal provided on the first principal surface and electrically connected to the penetrating electrode on the first principal surface.

10. The electronic component according to claim 9, wherein the electric connection member is a bump.

11. The electronic component according to claim 9, wherein each of the first resonator and the second resonator is a piezoelectric resonator which obtains a signal of a predetermined resonant frequency from a bulk wave propagating inside a piezoelectric film.

12. The electronic component according to claim 9, wherein each of the first resonator and the second resonator is a surface acoustic wave resonator which obtains a signal of a predetermined resonant frequency from a surface acoustic wave propagating in a surface of a piezoelectric material.

13. The electronic component according to claim 9, said electronic component having a chip size package structure in which the first resonator and the second resonator are shielded with resin.

14. The electronic component according to claim 9, wherein the external connection terminal is one of a common terminal, a ground terminal, and an input/output terminal.

15. The electronic component according to claim 9, wherein the one end of the electrode, the electric connection member, and the terminal of the first resonator are arranged sequentially in a direction intersecting with the second principal surface.

* * * * *